(12) United States Patent
Armstrong et al.

(10) Patent No.: US 9,599,683 B2
(45) Date of Patent: Mar. 21, 2017

(54) CERAMIC CAMERA FOR MRI (71) Applicant: UWM Research Foundation, Inc., Milwaukee, WI (US)

(72) Inventors: Brian S. R. Armstrong, Shorewood, WI (US); Todd P. Kusik, Wauwatosa, WI (US); Robert T. Barrows, Wauwatosa, WI (US)

(73) Assignee: UWM Research Foundation, Inc., Milwaukee, WI (US)

( * ) Notice: Subject to any disclaimer, the term of this patent is extended or adjusted under 35 U.S.C. 154(b) by 500 days.

(21) Appl. No.: 14/358,938

(22) PCT Filed: Nov. 14, 2012

(86) PCT No.: PCT/US2012/064945
§ 371 (c)(1),
(2) Date: May 16, 2014

(87) PCT Pub. No.: WO2013/074578
PCT Pub. Date: May 23, 2013

(65) Prior Publication Data
US 2014/0354282 A1    Dec. 4, 2014

(51) Int. Cl.
*G01R 33/28* (2006.01)
*H04N 5/225* (2006.01)
(Continued)

(52) U.S. Cl.
CPC ......... *G01R 33/283* (2013.01); *H04N 5/2254* (2013.01); *H04N 5/2256* (2013.01); *H04N 5/23241* (2013.01); *G01R 33/5673* (2013.01)

(58) Field of Classification Search
CPC ............. G01R 33/283; G01R 33/5673; H04N 5/23241; H04N 5/2256; H04N 5/2254
See application file for complete search history.

(56) References Cited

U.S. PATENT DOCUMENTS 6,069,652 A    5/2000  Eversole et al.
6,198,285 B1   3/2001  Kormos et al.
(Continued)

FOREIGN PATENT DOCUMENTS

EP    1222894    7/2002

OTHER PUBLICATIONS

Auerkari, P., "Mechanical and physical properties of engineering alumina ceramics," VTT Manufacturing Technology (1996) 1-26.
(Continued)

*Primary Examiner* — G. M. Hyder
(74) *Attorney, Agent, or Firm* — Michael Best & Friedrich LLP (57) ABSTRACT

A camera assembly for use in a MRI machine. The camera assembly includes a Faraday cage defining a shielded cavity and an optical path mount constructed of a highly stiff, dense, and non-electrically-conductive material in the shielded cavity. The camera imager and lens are mounted to the optical path mount. The camera assembly includes a capacitor-based power regulation circuit. The optical path mount is not subject to eddy currents because it is non-electrically-conductive. The capacitor-based power regulation circuit includes very little ferrous material and is within the shielded cavity, to reduce eddy currents. The resulting camera assembly reduces vibrations and shaking in the magnetic field environment of the MRI machine.

18 Claims, 4 Drawing Sheets

(51) Int. Cl.
*H04N 5/232* (2006.01)
*G01R 33/567* (2006.01)

(56) References Cited

U.S. PATENT DOCUMENTS

| | | |
|---|---|---|
| 6,239,831 B1 | 5/2001 | Eversole et al. |
| 6,628,339 B1 | 9/2003 | Ferland et al. |
| 6,778,209 B1 | 8/2004 | Eversole et al. |
| 2003/0007084 A1* | 1/2003 | Nakjoh ............ H01L 27/14621 |
| | | 348/340 |
| 2005/0104590 A1 | 5/2005 | Sinnema et al. |
| 2005/0283068 A1 | 12/2005 | Zuccolotto et al. |
| 2007/0146534 A1 | 6/2007 | Kim et al. |
| 2008/0210674 A1 | 9/2008 | Mazumder et al. |
| 2008/0272786 A1 | 11/2008 | Luedeke et al. |
| 2009/0128681 A1 | 5/2009 | Kim |
| 2011/0109791 A1 | 5/2011 | Obara et al. |
| 2011/0230755 A1 | 9/2011 | MacFarlane et al. |

OTHER PUBLICATIONS

Qualisys, "Motion Capture Systems, OQUS MRI, Qualisys MRI-compatible motion capture system," Medical Science, Qualisys AB (available in Dec. 2011).
PCT/US2012/64945 International Preliminary Report on Patentability dated Jan. 17, 2014 (5 pages).
PCT/US2012/64945 International Search Report and Written Opinion dated Feb. 8, 2013 (15 pages).

\* cited by examiner

CERAMIC CAMERA FOR MRI

STATEMENT REGARDING FEDERALLY SPONSORED RESEARCH

This invention was made with government support under Grant Number 1R01DA021146 awarded by the National Institutes of Health. The U.S. government has certain rights in this invention.

CROSS-REFERENCE TO RELATED APPLICATIONS

This application is a 371 national stage entry of International Application No. PCT/US2012/064945 filed Nov. 14, 2012, which claims priority to U.S. Provisional Application No. 61/561,603 filed Nov. 18, 2011, which are incorporated herein by reference in their entireties.

BACKGROUND

The present invention relates to a camera assembly for use in a MRI machine. The camera captures images of a motion tracking marker on the patient within the MRI machine, and provides patient position information to a controller that constantly adjusts the -pulse sequence of the MRI machine to accommodate movement of the patient.

SUMMARY

In one embodiment, the invention provides a camera comprising: an optical path mount integrally formed with an imager mounting surface and a lens mounting surface, the optical path mount being a massive element constructed of a highly stiff and non-electrically-conductive material, with mass at least twice as great as that of the imager and lens, modulus of elasticity of at least 2 giga-Pascals, and resistivity of at least $10^6$ Ohm-centimeters; an imager directly mounted to the imager mounting surface; and a lens directly mounted to the lens mounting surface.

In some embodiments, the optical path mount is constructed of ceramic. In some embodiments, the mass of the optical path mount is at least five times as great as the combined mass of the imager and lens. In some embodiments, the lens collects images of an imaging volume, and the camera further comprises a lighting system to illuminate the imaging volume. In some embodiments, the lens collects the images along a direct axis. In some embodiments, the lighting system includes a ring light surrounding the direct axis.

In some embodiments, the camera further comprises: a light source producing light; and a partially silvered mirror; wherein the light shines through the partially silvered mirror to illuminate an imaging volume; and wherein the partially silvered mirror reflects an image of the imaging volume to the lens. In some embodiments, the optical path mount includes a mirror mounting surface; and the partially silvered mirror is directly mounted to the mirror mounting surface. In some embodiments, the camera further comprises a Faraday cage enclosing the imager and optical path mount and at least partially enclosing the lens; wherein said lens forms a portion of the Faraday cage.

The invention also provides a camera assembly comprising: a digital camera; and a capacitor-based power regulation circuit that does not incorporate inductors; wherein the capacitor-based power regulation circuit provides power for operation of the digital camera.

In some embodiments, said digital camera includes a fiber-optic interface for transmitting images. In some embodiments, said fiber-optic interface for transmitting images includes lasers and said lasers are non-ferrous. In some embodiments, the camera assembly further comprises a Faraday cage enclosing the digital camera and circuit. In some embodiments, the camera assembly further comprises a lighting system; wherein said digital camera includes a lens; and wherein said lens and lighting system are arranged to permit imaging a range of depths from 100 mm to 700 mm.

The invention also provides a magnetic resonance imaging (MRI) apparatus, comprising: a MRI scanner for accommodating a patient; a magnet generating a magnetic field; gradient coils generating dynamic magnetic field gradients within the MRI scanner; radio-frequency (RF) coils generating RF energy within the MRI scanner; a camera assembly including a Faraday cage defining a shielded cavity, an imager, a lens, and an optical path mount constructed of a material with mass at least twice as great as the combined mass of the imager and lens, the optical path mount having a modulus of elasticity of at least 2 giga-Pascals and resistivity of at least $10^6$ Ohm-centimeters, the optical path mount being positioned within the shielded cavity, the imager and lens being mounted to the optical path mount within the shielded cavity; and a mounting assembly for mounting the camera assembly within the MRI scanner; wherein the Faraday cage includes an aperture through which the camera lens receives images of the patient within the MRI scanner; and wherein the Faraday cage shields all elements within the shielded volume from the RF energy generated by the RF coils.

In some embodiments, the optical path mount is constructed of ceramic. In some embodiments, the mass of the optical path mount is at least five times as great as the combined mass of the imager and lens. In some embodiments, the lens receives images of the patient along a direct axis; the MRI apparatus further comprising a ring light surrounding the direct axis and illuminating the patient. In some embodiments, the ring light is mounted on an external surface of the Faraday cage and surrounds the aperture. In some embodiments, the camera includes a light source producing light and a partially silvered mirror; the light shines through the partially silvered mirror to illuminate the patient; and the partially silvered mirror reflects an image of the patient to the lens. In some embodiments, the optical path mount includes a mirror mounting surface; and the partially silvered mirror is directly mounted to the mirror mounting surface. In some embodiments, the MRI apparatus further comprises a capacitor-based power regulation circuit that does not incorporate inductors; the circuit being mounted within the shielded cavity and providing power for operation of the digital camera assembly.

The invention also provides a camera assembly comprising: a Faraday cage defining a shielded cavity; an imager; a lens; a massive optical path mount constructed of a highly stiff, and non-electrically-conductive material with mass at least twice as great as that of the combined imager and lens, and modulus of elasticity of at least 2 giga-Pascals and resistivity of at least $10^6$ Ohm-centimeters in the shielded cavity, the imager and lens being mounted to the optical path mount; and a capacitor-based power regulation circuit that does not incorporate inductors mounted within the shielded cavity and providing power for operation of the camera assembly; wherein the Faraday cage includes an aperture through which the camera lens receives images of the patient within the MRI scanner; and wherein the Faraday cage shields all elements within the shielded volume from RF energy surrounding the Faraday cage.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
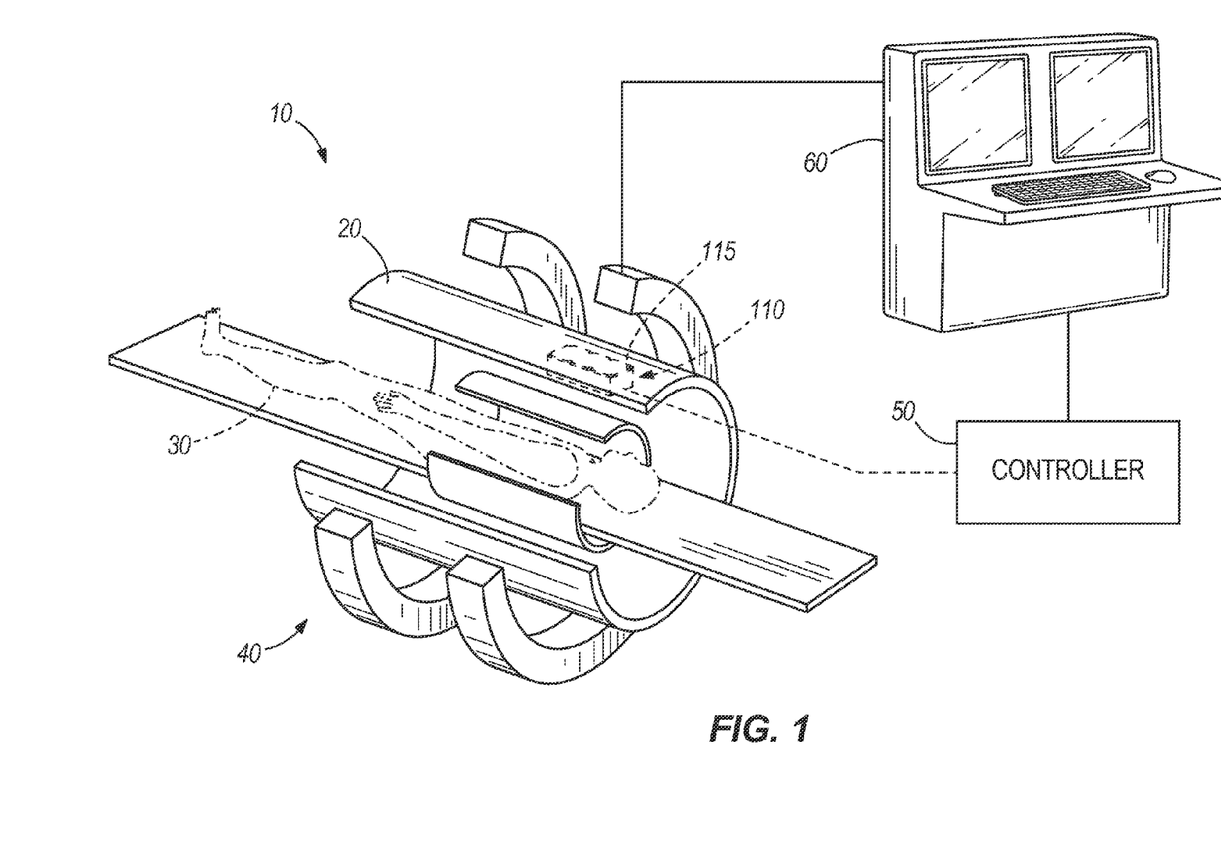
FIG. 1 is a schematic illustration of a MRI machine incorporating a camera assembly according to the present invention.

FIG. 1 illustrates a magnetic resonance imaging (MRI) apparatus or machine 10 that includes a MRI scanner 20 for accommodating a patient 30, MRI scanner 20 incorporating gradient coils generating dynamic magnetic field gradients within the MRI scanner and RF coils generating RF energy within the MRI scanner, a magnetic field generator 40 that generates a steady magnetic field within the MRI scanner 20, a controller 50 that controls operation of the MRI machine 10, and a workstation 60 with a display and user interface for an operator of the MRI machine 10. In known MRI machines, images of the patient 30 can become blurry as a result of movement of the patient 30. This is true even of very slight and subtle movement of the patient arising from, for example, breathing.

The dynamic magnetic field gradients of the MRI machine 10 can give rise to eddy currents in any electrically-conductive components in the field. Such eddy currents can cause the components to vibrate. Vibrations of the camera assembly introduce errors in the motion tracking data and degrade the quality of MR images. The present invention addresses the challenge of positioning a camera assembly in such magnetic field and minimizing vibration of the camera assembly.

The present invention provides a camera assembly 110 that is mounted within the MRI scanner 20 with a mounting assembly 115. As will be described in more detail below, the camera assembly 110 is designed to operate within the magnetic field, dynamic magnetic field gradients and RF energy of the MRI machine 10. The controller 50 receives patient position information from the camera 110 and continuously adjusts the pulse sequence. The controller 50 adjusts the pulse sequence to follow movement of the patient 30 so that the dynamic field gradients and RF energy are always properly and consistently aligned with the patient 30. This accommodates movement of the patient 30 and results in a clearer MRI image. The camera may be of the digital camera variety in some embodiments.

Figure 2:
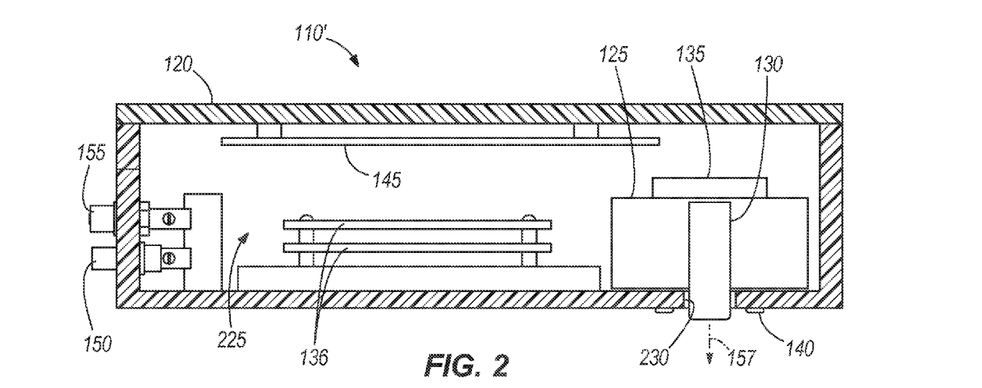
FIG. 2 is a cross-section of a first configuration of the camera assembly.

Referring now to FIG. 2, a first construction of the camera assembly 110' includes a Faraday cage 120, an optical path mount 125, a lens 130, an imager 135, camera electronics 136, a light source 140, a circuit board 145, a power connector 150, and a communications connector 155. The lens 130 receives images along an optical path 157.

Figure 3:
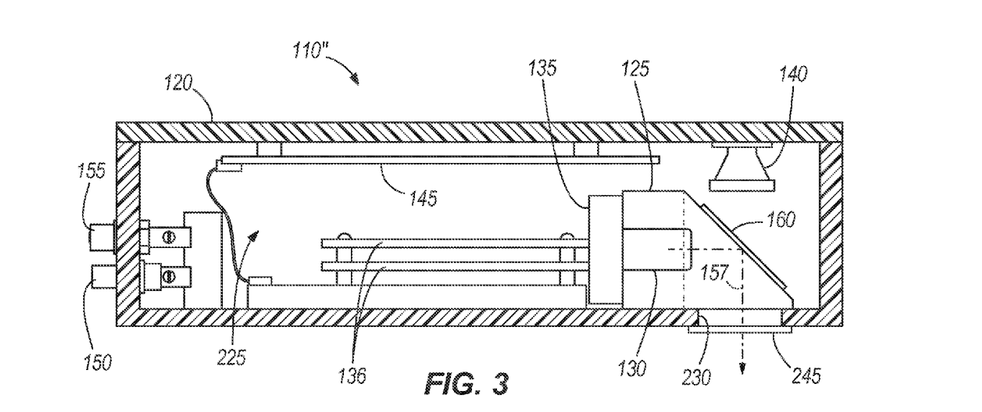
FIG. 3 is a cross-section of a second configuration of the camera assembly.

With reference to FIG. 3, a second construction of the camera assembly 110" includes all elements noted above and also a partially-silvered mirror 160. The first and second constructions of the camera assembly 110' and 110" will together be referred to as the camera assembly 110 unless a specific reference is being made to one of the constructions.

The primary difference between the first and second camera constructions 110', 110" is the optical path 157. When the lens 130 receives the image from the subject along a straight axis (as in FIG. 2), the optical path 157 is a direct optical path. When the lens 130 receives a reflected image of the subject (as in FIG. 3), the optical path 157 is an indirect optical path.

Figure 4:
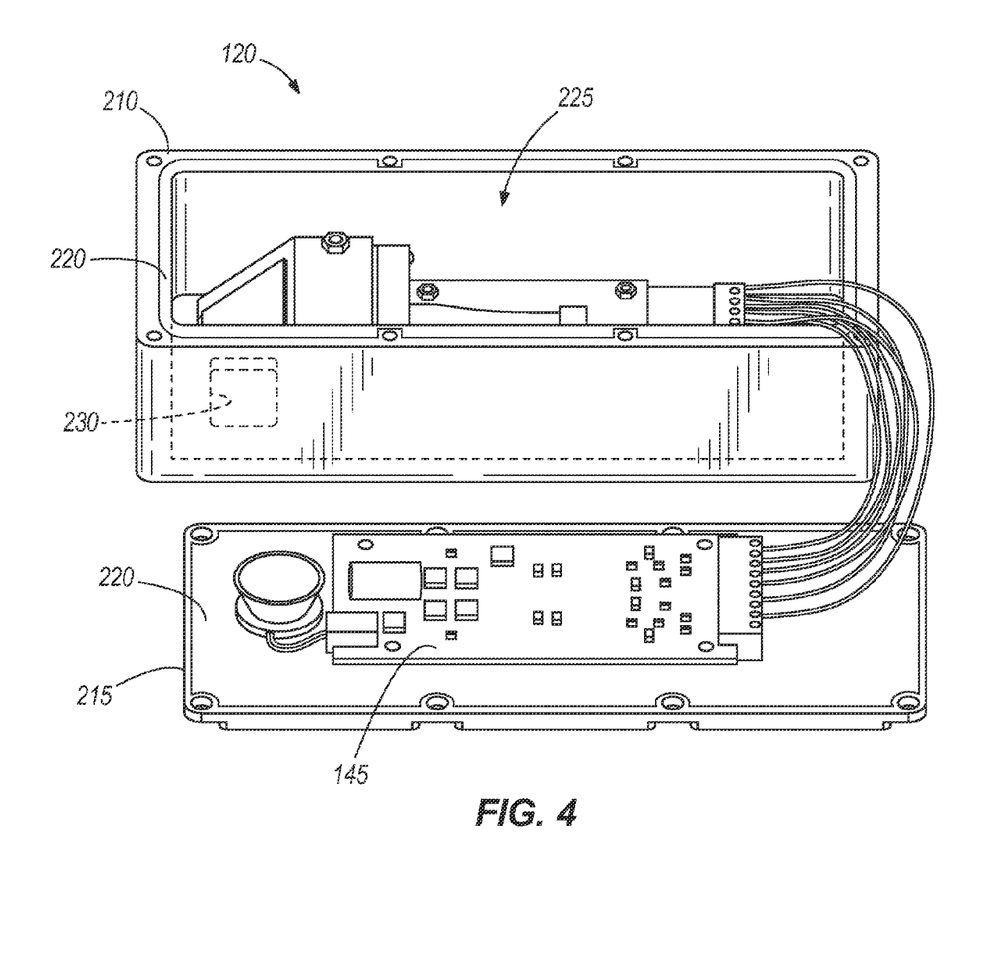
FIG. 4 is a perspective view of the camera assembly opened.

With reference to FIG. 4, the Faraday cage 120 includes a box 210 and a lid 215. The floor and walls of the box 210, as well as the lid 215, are lined with shielding material 220 to prevent the RF energy within the MRI scanner from affecting anything inside the Faraday cage 120, and to prevent RF energy generated by the camera and power regulation circuit from escaping and interfering with the MRI scanner. The box 210 and lid 215 define a shielded cavity 225 in which the rest of the camera assembly 110 may be positioned.

The floor of the box 210 includes an aperture 230 through which the optical path 157 passes. The lens 130 extends through the aperture 230 in the first construction 110' of FIG. 2, and the outer surface of the lens 130 is sealed to the Faraday cage 120. In such an arrangement, the lens 130 may be considered part of the Faraday cage 120 because it functions as a wave guide and blocks the aperture 230. In the second construction 110" of FIG. 3, a shielding mesh or screen 245 covers the aperture 230 to shield the cavity 225 from the RF energy within the MRI scanner.

The optical path mount 125 supports the lens 130 and imager 135 in the first construction 110' and supports the lens 130, imager 135, and mirror 160 in the second construction 110".

Figure 5:
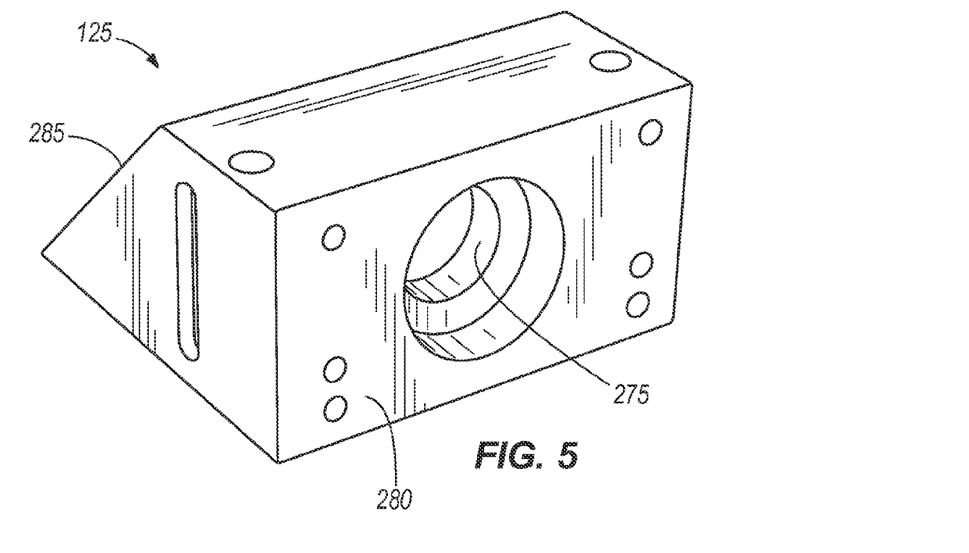
FIG. 5 is a perspective view of an optical path mount of the second construction.
Figure 6:
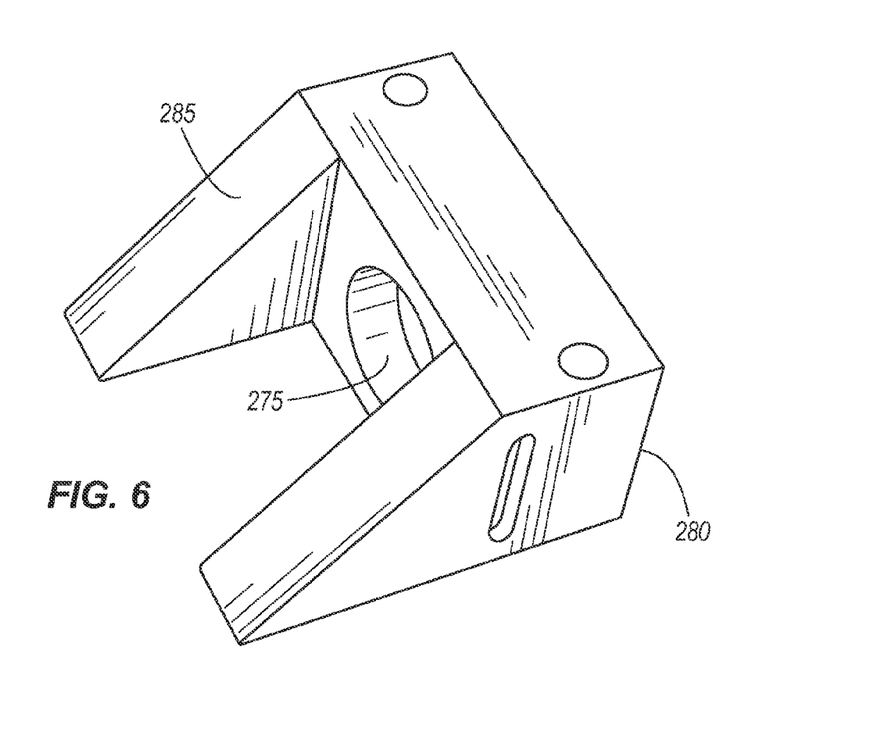
FIG. 6 is another perspective view of the optical path mount.

FIGS. 5 and 6 illustrate the optical path mount 125 for the second construction 110". The optical path mount 125 includes a lens mounting surface 275 to which the lens 130 is mounted, an imager mounting surface 280 to which the imager 135 is mounted, and a mirror mounting surface 285 to which the mirror 160 is mounted. The optical path mount 125 for the first construction 110' only requires the lens mounting surface 275 and imager mounting surface 280 because there is no mirror.

The optical path mount 125 is a massive element constructed of a highly stiff, dense, and non-electrically-conductive material. One example of a highly stiff, dense, and non-electrically-conductive material is ceramic. The stiffness (high modulus of elasticity) of the material makes it less prone to flexing, while the mass of the optical path mount makes it less prone to vibration. The non-electrically-conductive material property makes the material immune to eddy currents arising from the dynamic magnetic field gradients.

The lens 130 is directly mounted to the lens mounting surface 275 in the illustrated embodiment. The term "directly mounted" means mounted without any intervening elements. In other embodiments, the lens 130 may be mounted to the lens mounting surface 175 through intervening elements. The lens 130 collects an image of the patient 30 within the MRI magnet 20. The effective field from which the lens 130 collects the image may be referred to as the imaging volume. In one example embodiment, the lens 130 and the lighting source 140 are arranged to permit imaging a range of depths from 100 mm to 700 mm.

The imager 135 is directly mounted to the imager mounting surface 280. In other embodiments, the imager 135 may be mounted to the imager mounting surface 280 through intervening elements. The imager 135 receives the image collected by the lens 130 and converts it to a digital image.

The light source 140 can be a ring light (as in FIG. 2) or another type of light source. The light source 140 illuminates the imaging volume along a light axis. In the first construction 110' (FIG. 2), the lens 130 extends through the aperture 230 in the Faraday cage, and the ring light 140 is mounted to an external surface of the Faraday cage 120, surrounding the aperture 230.

In the second construction 110", the partially-silvered mirror 160 is between the light source 140 and the aperture 230, inside the shielded cavity 225, and the light axis extends through the mirror 160 and out the aperture 230. The image of the patient reaches the partially silvered mirror 160 along the light axis, and then is reflected by the partially-silvered mirror 160 to the lens 130 along the lens axis.

The partially-silvered mirror 160 is directly mounted to the mirror mounting surface 285. In other embodiments, the mirror 160 may be mounted to the mirror mounting surface 285 through intervening elements. The partially-silvered mirror 160 may also be referred to as a beam splitter. The mirror 160 permits a fraction of the light to pass through it and reflects the remainder of the light.

The circuit board 145 carries a capacitor-based power regulation circuit that does not include inductors that would interact with the magnetic field. The circuit board 145 and circuit are designed to minimize as much as is practical the number and amount of ferrous components and ferrous material. The circuit provides power for operation of the camera assembly 110.

The power connector 150 provides a power input for the camera assembly 110. In the illustrated embodiments, the power connector 150 is a direct current (DC) plug extending out of the Faraday cage 120.

The communications connector 155 establishes communications from the controller 50 to the camera electronics 136. In the illustrated embodiment, the communications connector 155 is a fiber-optic interface for receiving a fiber-optic cable. The connector 155 extends out of the Faraday cage 120. The circuit is able to transmit or deliver images to the workstation 60 outside of the MRI room by way of the fiber-optic cable, and also to receive commands from the workstation through the fiber-optic cable. In some embodiments, the fiber-optic interface includes lasers that are non-ferrous.

In some embodiments, the power connector 150 and communications connector 155 can be integrated into a single connector.

In operation, the camera assembly 110 is used to identify a motion tracking marker on the patient 30. The marker may be mounted, for example, on the patient's nose or elsewhere on the patient's head. The imager 130, through the communications connector 155 and a communications line, provides an image of the marker to the controller 50. The controller 50 interprets the image of the marker and calculates the three-dimensional position and attitude of the patient's head based on the position and attitude of the marker. The controller 50 uses this information to adjust the pulse sequence of the MRI machine so that a consistent, clear MRI image of the patient is received at the workstation 60.

Vibration during operation of camera assembly 110 will introduce errors in the three-dimensional position and attitude data provided by camera assembly 110 to controller 50, and reduce the clarity of the MRI images produced. Vibration is introduced by 1) eddy currents in conductive elements of the camera assembly 110 that react with the steady magnetic field of the MRI machine to produce vibratory forces, 2) relative motion of the of lens 130 and imager 135, or lens 130, imager 135 and mirror 160 (collectively referred to as the imaging components) introduced by flexure of their supports, and 3) vibration of the camera assembly 110 as a whole, imparted by vibration of the MRI machine. Forces imparted by eddy currents and by vibration of the MRI machine are hereinafter collectively referred to as residual forces.

The present invention mitigates vibrations in these ways: 1) the camera path mount is made of non-electrically conductive material with a resistivity of at least $10^6$ Ohm-centimeters, and thus does not perceptibly add to eddy currents, 2) being made of a stiff material with modulus of elasticity of at least 2 giga-Pascals, the optical path mount minimizes relative motion of the imaging components, and 3) by being several times more massive than the imaging components to reduce vibrations. Through Newton's second law, which can be formulated to state that acceleration is equal to applied force divided by mass, a massive optical path mount reduces vibrations produced by residual forces present in the camera assembly, including forces imparted by residual eddy currents. For example, if the optical path mount with mounted imaging components is two times more massive than the imaging components alone, vibrations will be reduced to half, and if the optical path mount with mounted imaging components is five times more massive than the imaging components alone, vibrations will be reduced by a factor of five.

Thus, the invention provides, among other things, a camera assembly that is suitable for use in the magnetic field, dynamic field gradients and RF energy of a MRI machine. Various features and advantages of the invention are set forth in the following claims.

What is claimed is:

1. A camera comprising:
an optical path mount integrally formed with an imager mounting surface and a lens mounting surface, the optical path mount having a mass at least twice as great as that of the imager and lens, a modulus of elasticity of at least 2 giga-Pascals, and resistivity of at least $10^6$ Ohm-centimeters;
an imager directly mounted to the imager mounting surface; and
a lens directly mounted to the lens mounting surface.

2. The camera of claim 1, wherein the optical path mount is constructed of ceramic.

3. The camera of claim 1, wherein the mass of the optical path mount is at least five times as great as the combined mass of the imager and lens.

4. The camera of claim 1, wherein the lens collects images of an imaging volume, the camera further comprising a lighting system to illuminate the imaging volume.

5. The camera of claim 4, wherein the lens collects the images along a direct axis.

6. The camera of claim 5, wherein the lighting system includes a ring light surrounding the direct axis.

7. The camera of claim 1, further comprising:
a light source producing light; and
a partially silvered mirror;
wherein the light shines through the partially silvered mirror to illuminate an imaging volume; and
wherein the partially silvered mirror reflects an image of the imaging volume to the lens.

8. The camera of claim 7, wherein the optical path mount includes a mirror mounting surface; and wherein the partially silvered minor is directly mounted to the mirror mounting surface.

9. The camera of claim 1, further comprising a Faraday cage enclosing the imager and optical path mount and at least partially enclosing the lens; wherein said lens forms a portion of the Faraday cage.

10. A magnetic resonance imaging (MRI) apparatus, comprising:
a MRI scanner for accommodating a patient;
a magnet generating a magnetic field, gradient coils generating dynamic magnetic field gradients within the MRI scanner;
radio-frequency (RF) coils generating RF energy within the MRI scanner;
a camera assembly including a Faraday cage defining a shielded cavity, an imager, a lens, and an optical path mount constructed of a material with mass at least twice as great as the combined mass of the imager and lens, the optical path mount having a modulus of elasticity of at least 2 giga-Pascals and resistivity of at least $10^6$ Ohm-centimeters, the optical path mount being positioned within the shielded cavity, the imager and lens being mounted to the optical path mount within the shielded cavity; and
a mounting assembly for mounting the camera assembly within the MRI scanner;
wherein the Faraday cage includes an aperture through which the camera lens receives images of the patient within the MRI scanner; and
wherein the Faraday cage shields all elements within the shielded volume from the RF energy generated by the RF coils.

11. The MRI apparatus of claim 10, wherein the optical path mount is constructed of ceramic.

12. The MRI apparatus of claim 10, wherein the mass of the optical path mount is at least five times as great as the combined mass of the imager and lens.

13. The MRI apparatus of claim 10, wherein the lens receives images of the patient along a direct axis; the MRI apparatus further comprising a ring light surrounding the direct axis and illuminating the patient.

14. The MRI apparatus of claim 13, wherein the ring light is mounted on an external surface of the Faraday cage and surrounds the aperture.

15. The MRI apparatus of claim 10, wherein the camera includes a light source producing light and a partially silvered minor; wherein the light shines through the partially silvered mirror to illuminate the patient; and wherein the partially silvered mirror reflects an image of the patient to the lens.

16. The MRI apparatus of claim 15, wherein the optical path mount includes a mirror mounting surface; and wherein the partially silvered minor is directly mounted to the mirror mounting surface.

17. The MRI apparatus of claim 10, further comprising a capacitor-based power regulation circuit that does not incorporate inductors; the circuit being mounted within the shielded cavity and providing power for operation of the digital camera assembly.

18. A camera assembly comprising:
a Faraday cage defining a shielded cavity;
an imager;
a lens;
an optical path mount having a mass at least twice as great as that of the combined imager and lens, a modulus of elasticity of at least 2 giga-Pascals and a resistivity of at least $10^6$ Ohm-centimeters in the shielded cavity, the imager and lens being mounted to the optical path mount; and
a power regulation circuit providing power for operation of the camera assembly;
wherein the Faraday cage includes an aperture through which the camera lens receives images of the patient within the MRI scanner; and
wherein the Faraday cage shields all elements within the shielded volume from RF energy surrounding the Faraday cage.

* * * * *

UNITED STATES PATENT AND TRADEMARK OFFICE
CERTIFICATE OF CORRECTION

PATENT NO. : 9,599,683 B2
APPLICATION NO. : 14/358938
DATED : March 21, 2017
INVENTOR(S) : Brian S. R. Armstrong, Todd P. Kusik and Robert T. Barrows Page 1 of 1

It is certified that error appears in the above-identified patent and that said Letters Patent is hereby corrected as shown below:

In the Claims

Column 8, Claim 16, Line 20: replace the word "minor" with the word --mirror--

Signed and Sealed this
Fifth Day of September, 2017

Joseph Matal
*Performing the Functions and Duties of the*
*Under Secretary of Commerce for Intellectual Property and*
*Director of the United States Patent and Trademark Office*